United States Patent [19]

Conner

[11] Patent Number: 5,268,314
[45] Date of Patent: Dec. 7, 1993

[54] METHOD OF FORMING A SELF-ALIGNED BIPOLAR TRANSISTOR

[75] Inventor: George W. Conner, Ben Lomond, Calif.

[73] Assignee: Philips Electronics North America Corp., New York, N.Y.

[21] Appl. No.: 830,783

[22] Filed: Feb. 3, 1992

Related U.S. Application Data

[63] Continuation-in-part of Ser. No. 562,069, Aug. 2, 1990, abandoned, which is a continuation-in-part of Ser. No. 465,709, Jan. 16, 1990, abandoned.

[51] Int. Cl.$^5$ .......................................... H01L 21/331
[52] U.S. Cl. ........................................ 437/31; 437/32; 437/33; 437/70; 437/917; 148/DIG. 10; 148/DIG. 11
[58] Field of Search ............... 437/31, 32, 33, 162, 437/909, 917, 61, 63, 64, 69, 70; 148/DIG. 10, DIG. 11; 357/34, 35, 59 H

[56] References Cited

U.S. PATENT DOCUMENTS

| | | | |
|---|---|---|---|
| 4,252,582 | 2/1981 | Anantha et al. | 437/46 |
| 4,412,378 | 11/1983 | Shinada | 437/36 |
| 4,682,409 | 7/1987 | Thomas et al. | 437/201 |
| 4,738,624 | 4/1988 | Iyer et al. | 148/DIG. 11 |
| 4,745,080 | 5/1988 | Scovell et al. | 437/50 |
| 4,857,476 | 8/1989 | Colinge | 437/31 |
| 4,859,630 | 8/1989 | Josquin | 148/DIG. 11 |
| 4,897,364 | 1/1990 | Nguyen et al. | 437/69 |

FOREIGN PATENT DOCUMENTS

| | | | |
|---|---|---|---|
| 0293850 | 11/1988 | Japan | 437/70 |
| 0030245 | 2/9189 | Japan | 437/70 |

OTHER PUBLICATIONS

Cuthbertson et al., "Self-Aligned Transistors with Polysilicon Emitters for Bipolar VLSI", IEEE Transactions on Electronic Devices, vol. Ed-32, No.2, Feb. 1985, pp. 242-247.

*Primary Examiner*—Brian E. Hearn
*Assistant Examiner*—Tuan Nguyen
*Attorney, Agent, or Firm*—Leroy Eason

[57] ABSTRACT

A bipolar transistor device having reduced collector-base capacitance and advantageous extrinsic base resistance properties is fabricated by a self-aligned process. Successively formed first and second self-aligned masking spacers are utilized to define the collector-base junction area and to permit the conductivity of base link and base contact portions of the extrinsic base to be independently established.

9 Claims, 5 Drawing Sheets

METHOD OF FORMING A SELF-ALIGNED BIPOLAR TRANSISTOR

RELATED APPLICATION

This application is a continuation-in-part of copending application Ser. No. 07/562,069, filed Aug. 2, 1990, now abandoned, which is a continuation-in-part of application Ser. No. 07/465,709, filed Jan. 16, 1990, which prior applications are now abandoned.

BACKGROUND OF THE INVENTION

1. Field of the Invention

This invention relates to bipolar transistors, and more particularly to a self-aligned process for making bipolar transistors characterized by a low collector-base capacitance and a low extrinsic base resistance.

2. Description of the Related Art

The fabrication of bipolar transistor devices in integrated-circuit form typically involves a standard sequence of masking and alignment steps. In practice, overlay tolerances associated with these steps impose a limit on the minimum achievable size of certain critical device features.

Thus, for example, limitation inherent in such a standard device fabrication sequence dictate the minimum area of the collector-base junction of a bipolar transistor. This area determines the capacitance of the collector-base junction. In turn, this capacitance is largely determinative of the maximum speed of operation of the bipolar device.

Various self-aligned processes for making bipolar transistor devices have been developed. These do not rely on masking and alignment steps to define the collector-base junction. Hence, a device exhibiting a small collector-base junction area and low capacitance can thereby be achieved.

However, self-aligned processes as heretofore proposed for making bipolar transistors typically suffer from several disadvantages. For example, some bipolar devices made by such processes compromise the extrinsic base resistance by utilizing doped polysilicon as the base contact material. Additionally, the dopant concentration in the base link portion of the extrinsic base, by which the intrinsic base is connected to the base contact, often depends on diffusion out of the doped polysilicon base contact. As a result, the resistance of the base link is rarely optimum and is usually undesirably high. For these reasons, the extrinsic base resistance is also frequently high. Consequently, the speed of operation of even small-area collector-base junction devices made by such priorly known processes is often thereby deleteriously affected.

Accordingly, efforts have contained by workers skilled in the art aimed at trying to devise an improved process for making a bipolar transistor device. In particular, these efforts have been directed primarily at developing a self-aligned process for making a device that exhibits both a small collector-base junction area and a low extrinsic base resistance. It was realized that such efforts, if successful, would provide a small bipolar transistor having an advantageous high-speed operating characteristic.

SUMMARY OF THE INVENTION

In accordance with the principles of the present invention, a bipolar transistor device is made by a process in which the area of the collector-base junction is determined solely be self-alignment techniques. In accordance with the invention, self-alignment is achieved by a two-step sequence in which spacers are successively formed adjoining the emitter of the device and overlying a region in which the base is formed. In the first step, a first-formed self-aligned spacer precisely defines the overall width of the intrinsic base and the laterally adjoining extrinsic base in which the base link and the base contact are to be formed. After removing the first spacer, the extrinsic base region is doped to provide a specified low resistance base link portion therein. In the second step, a second self-aligned spacer is formed overlying only the base link. With the link thus covered, the remaining uncovered portion of the extrinsic base is then doped to convert it into a low-resistance base contact.

By this process, both the collector-base junction area and the extrinsic base resistance of a bipolar transistor device can be precisely established at values that ensure high-speed operation of the device.

BRIEF DESCRIPTION OF THE DRAWINGS

A more complete understanding of the present invention and of the above and other advantages and features thereof will be apparent from the detailed description presented below in connection with the accompanying drawing, not drawn to scale, in which.

DESCRIPTION OF THE PREFERRED EMBODIMENTS

Figure 1:
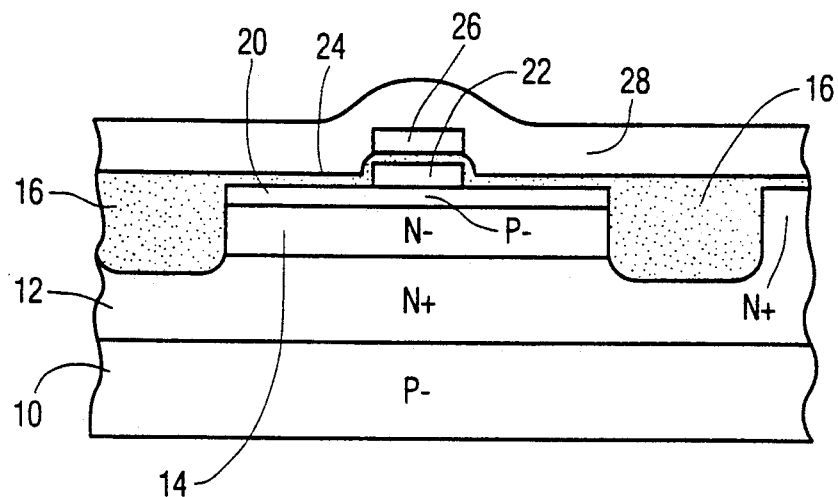
FIGS. 1 through 8 are each transverse cross-sections of a bipolar transistor device at various stages of fabrication carried out by a specific illustrative process that embodies the principles of the present invention.

FIG. 1 is a transverse cross-section of a portion of a semiconductor wafer made, for example, of silicon. In accordance with the principles of the present invention, multiple bipolar transistor devices can be simultaneously fabricated in the wafer in integrated circuit form. By way of a specific illustrative example, the fabrication of an NPN device in the depicted wafer will be emphasized herein.

The wafer shown in FIG. 1 includes a P$^-$ substrate 10 in which a buried 10+ region 12 is formed by standard ion implantation techniques. In particular, a suitable dopant such as arsenic is implanted into the wafer to form the buried region 12 which comprises a low-resistance region that will constitute a connection to the collector of the herein-described bipolar transistor.

A conventional N$^-$ epitaxial layer 14 is then formed overlying the N+ region 12. Initially, the layer 14 extends to the surface of the wafer. By standard techniques, a recessed isolation region of silicon dioxide, such as that designated 16 in FIG. 1 is formed in the wafer which defines the lateral extent of the transistor which is to be formed. Subsequently, the portion of the N+ region 12 that extends to the surface of the wafer is ion-implanted and thermally treated in known ways to form a low-resistance contact to the collector. One such N+ portion of the region 12 is partially shown at the right-hand edge of FIG. 1.

Then, utilizing a mask and standard ion implantation, a P$^-$ surface region 20 is formed in the N$^-$ layer 14. After further processing, described later below, the base of the transistor will be derived from the region 20. In one particular illustrative embodiment, the region 20 shown in FIG. 1 has a thickness or height of about 1500 Angstrom units and an initial width of approximately 4 micrometers. The remaining portions of the layer 14 underlying the region 20 constitutes the collector of the bipolar transistor.

Region 22 shown in FIG. 1 is then defined. This is done, for example, by depositing a 5000-Angstrom-unit-thick layer of polysilicon on the entire top surface of the structure. The polysilicon is then doped with a suitable N-type dopant such as arsenic. By standard masking and etching techniques the doped polysilicon layer is then patterned to form the region 22, which constitutes the emitter of the bipolar device being fabricated. In one particular illustrative example, the width of the emitter region 22 is about one micrometer.

Figure 9A:
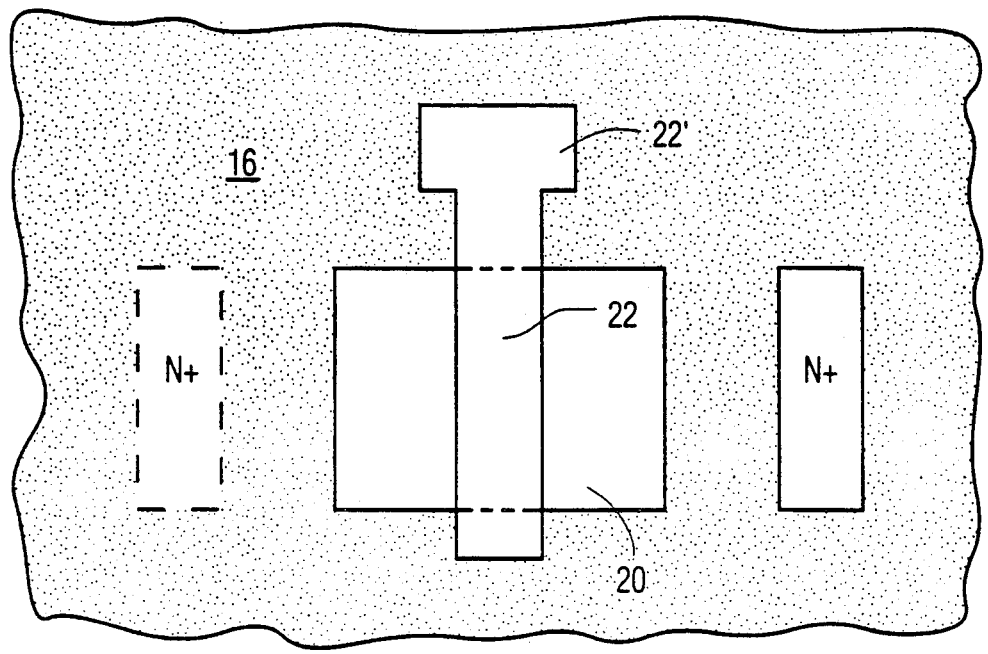
FIGS. 9a and 9b are alternative layout plans of the resulting device.
Figure 9B:
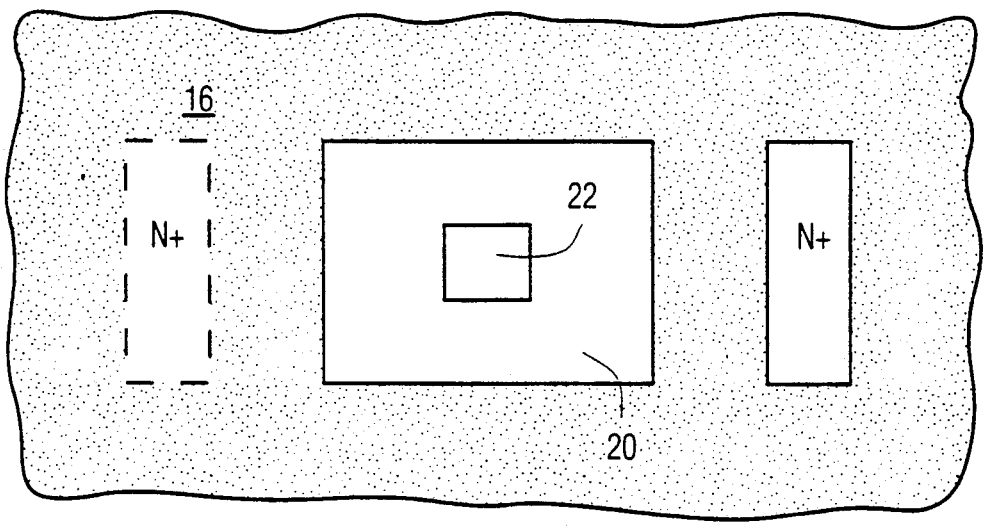

The layout plan of the bipolar device in FIG. 1, after completion of fabrication as described herein, may be essentially the same as heretofore employed for bipolar transistors in integrated circuits, a typical such layout plan being illustrated in FIG. 9a. Therein the N+ collector contact region is adjacent one side of the rectangular base region 20 but separated therefrom by the oxide isolation region which extends completely around the active regions of the device. In some cases, as shown dotted in FIG. 9a, another N+ collector contact region may be provided adjacent the opposite side of base region 20 and spaced therefrom the same distance as the first N+ contact region. The layout plan could alternatively be circular rather than rectangular, in which case the two N+ collector contact regions could effectively be a single annular region which extends around the base region. The emitter region 22 extends beyond the base region 20, and has an enlarged portion 22' at one end thereof to facilitate making contact thereto. A slightly modified form of the layout plan in FIG. 9a which has also been employed is shown in FIG. 9b. Therein the emitter region 22 is surrounded by the base region 20.

Returning to FIG. 1, next a thin layer 24 of silicon dioxide is grown on all exposed silicon and polysilicon surfaces of the device. The layer 24, which, for example, is about 150 Angstrom units thick, will act as an etch stop during subsequent processing, as described below.

Subsequently, the region 26 shown in FIG. 1 is formed. This is done by depositing a 5000 Angstrom units thick layer of a specified masking material on the entire top surface of the depicted structure. For reasons that will be apparent later below, the material so deposited is selected to be etchable in ways that cause little if any etching of silicon dioxide. One advantageous masking material for this purpose is commonly referred to as oxynitride, which comprises a known mixture of silicon dioxide and silicon nitride. A suitable layer of oxynitride can be deposited in a standard plasma-enhanced chemical-vapor-deposition (PECVD) step. Such layer is then masked and etched to form the region 26. By way of example, etching is carried out in a reactive-ion-etching step utilizing a $CF_4/O_2$ plasma.

A layer 28 of oxynitride is then deposited on the entire top surface of the FIG. 1 structure. Advantageously, the layer 28 is put down in two steps. First, a layer of oxynitride about 1000 Angstrom units thick is formed by low-pressure chemical vapor deposition (LPCVD). This provides a clean high-quality layer. Then, the remainder (one micrometer) of the layer 28 is formed relatively quickly in a PECVD step. At that point, the device being fabricated appears as shown in FIG. 1.

The thickness of the specific illustrative oxynitride layer 28 of FIG. 1 is 1.1 micrometers except in the sloped-top regions that respectively adjoin the sides of the regions that respectively adjoin the sides of the regions 22 and 26. The thickness of those sloped-top regions varies from about 1.1 to 2.1 micrometers.

Next, in a maskless anisotropic etching step, the oxynitride layer 28 is etched to expose portions of the thin oxide layer 24. Illustratively, this is done in a standard way in a reactive-ion-etching step utilizing a $CF_4/O_2$ plasma. In particular, about 1.1 micrometers of oxynitride material is thereby uniformly removed. In this way, all of the layer 28 is removed from the structure except for portions in the aforementioned sloped-top regions. A that point, the remainder of the oxynitride layer 28 and the oxynitride region 26 constitute an oxynitride spacer 30 which is shown in FIG. 2.

Figure 2:
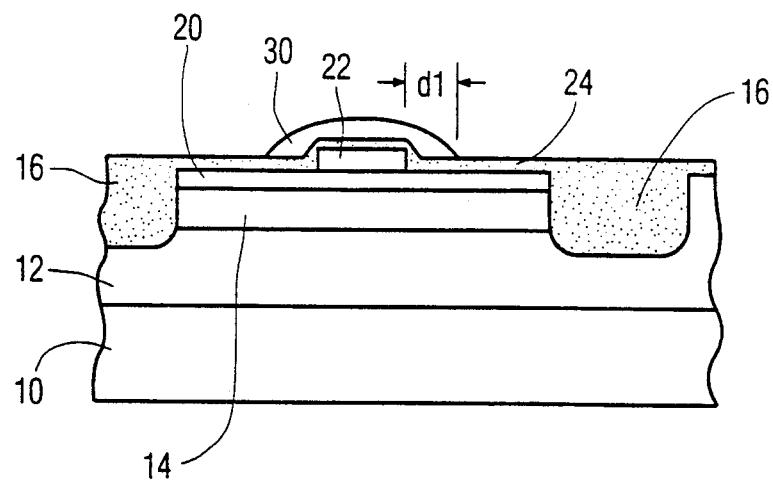

Significantly, the spacer 30 of FIG. 2 is exactly centrally aligned with respect to the emitter region 22 and overlies equal-width portions of the base region 20 which extend past region 22. The base is to be formed in the region 20. In one particular illustrative example, the width d1 of the extrinsic base portion covered by the spacer 30 is about one micrometer. This spacer width precisely determines the extent of the extrinsic base, including the base link and base contact portions to be formed therein, adjoining the intrinsic base which underlies the emitter 22.

The portions of the thin oxide layer 24 that overlie the base region 20 and are not covered by spacer 30, as shown in FIG. 2 are then removed. This is done, for example, in a conventional wet etching step utilizing hydrochloric acid. Subsequently, the exposed portion of the base region 20 is converted to silicon dioxide in a standard high-pressure oxidation system at a temperature of about 800° C. Dopant from the converted portion of the base region 20 is removed therefrom by being segregated in the newly formed oxide.

Figure 3:
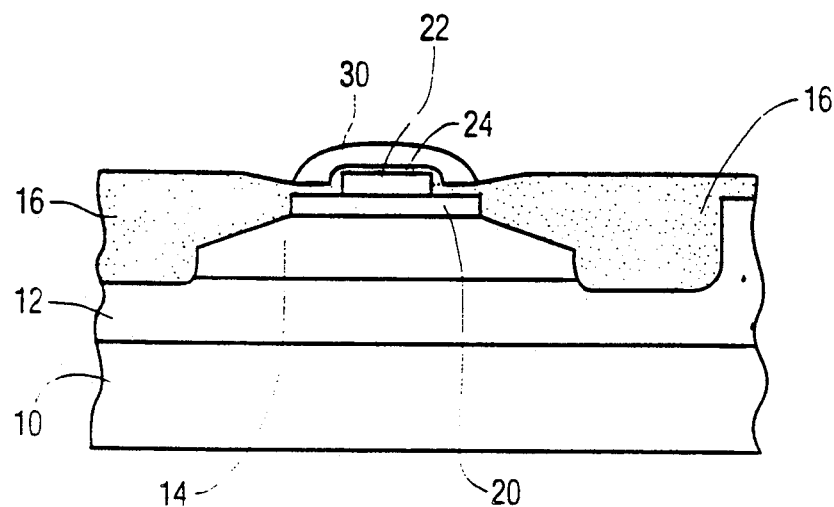

As a result of the aforedescribed oxidation step, the width of the base region 20 is reduced in an exactly controlled way to a value dictated by a desired value of the collector-base junction area. The final width of the base region 20 is shown in FIG. 3. It underlies and is precisely determined by the portion of the self-aligned spacer 30 which extends beyond emitter region 22. In the final device structure, the base region 20 shown in FIG. 3 comprises an intrinsic base which is centrally positioned with respect to self-aligned base link and base contact portions of an extrinsic base laterally adjacent the intrinsic base. The entire base region 20 is exactly centrally positioned with respect to the overlying emitter region 22.

Next, the oxynitride spacer element 30 shown in FIG. 3 is removed. This is done, for example, in a standard wet etching step utilizing hot phosphoric acid. During this removal step, polysilicon and silicon regions of the structure are protected from the etchant by the thin oxide layer 24. The structure then looks as shown in FIG. 4.

The extrinsic portion of the base region 20 is then implanted with a suitable dopant such as boron to achieve a prescribed conductivity therein. In that way, a base link is formed in the extrinsic base which is precisely tailored to contribute to a desirably low overall value of base resistance $r_b$). Also, the formation of the base link can be thereby controlled to take into account the goal of minimizing the occurrence of undesirable base-to-emitter tunneling currents in the device. In one particular illustrative embodiment, an implant concentration of about $4.0 \times 10^{13}$ boron ions per centimeter square at an energy of approximately 18,000 electron volts was effective to form a base link having the requisite characteristics for a high-quality high-speed bipolar transistor device. Arrows 23 and 25 in FIG. 4 schematically depict the implantation step.

Figure 4:
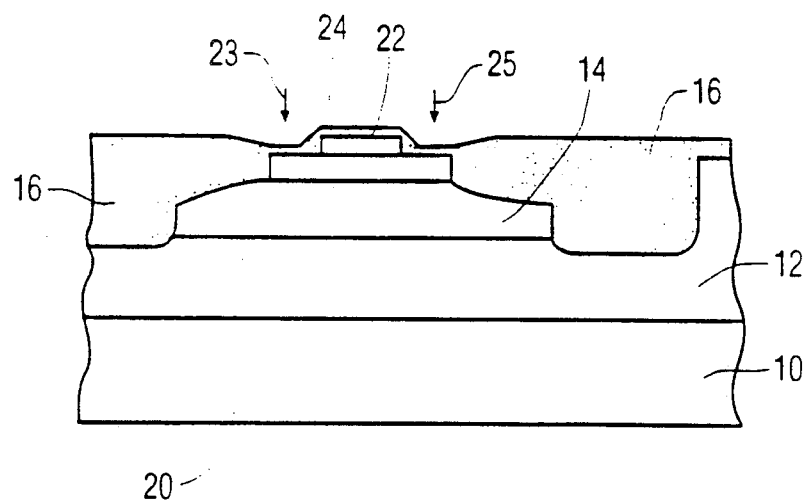
Figure 5:
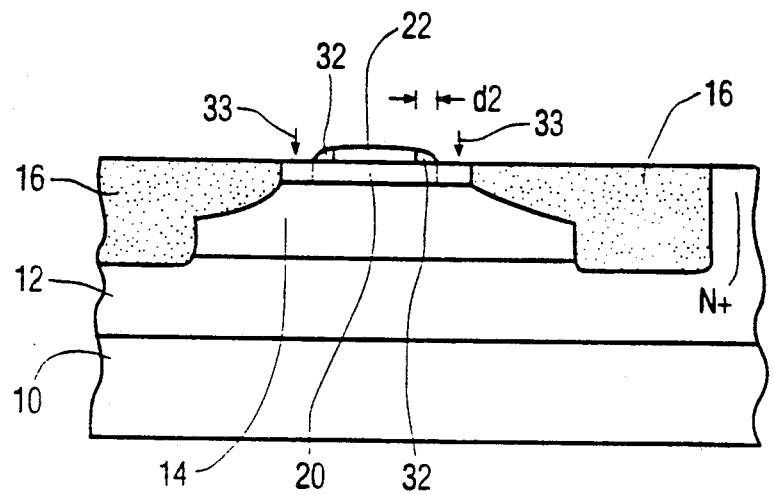

After the aforedescribed implantation, a layer of silicon dioxide is deposited on the entire top surface of the structure shown in FIG. 4. Illustratively, this layer is deposited to a thickness of about 4000 Angstrom units. Then, the deposited oxide layer is anisotropically etched in, for example, a standard reactive-ion-etching step in a $CHF_3/CO_2$ plasma to expose the surface of the emitter 22. All the deposited oxide except for a spacer element laterally adjoining the emitter region 22 is thereby removed. The self-aligned sidewall spacer element is shown in FIG. 5 designated by reference numeral 32. By way of a specific illustrative example, the width d2 of spacer 32 is about 0.25 micrometers. This spacer width is selected to protect the previously implanted underlying link portion of the base 20 from being affected during subsequent additional doping of the contact portion of the extrinsic base.

Next, the base contact portion of the extrinsic base is formed. This is done by implanting a P-type dopant such as boron into the portion of the base region 20 which extends beyond the base link portion thereof under spacer 32, as indicated in FIG. 5 by arrows 33. As noted above, the spacer 32 serves to mask the base link portion during this implantation. In that way, a low-resistance base contact is formed in the region 20 without deleteriously affecting the previously established doping level in the base link. The low-resistance contact so formed directly abuts the base link and extends to the end of the base region 20.

In a conventional masking and implantation step, the portion of the N+ region 12 that extends to the surface of the structure shown in FIG. 5 is then implanted with an N-type dopant such as arsenic. This ensures the establishment of a low-contact-resistance connection from the surface of the device to the buried collector region 14. Subsequently, in a standard rapid-thermal-annealing (RTA) step, the emitter is formed and all the implants are activated, in a manner well known in the art.

Figure 6:
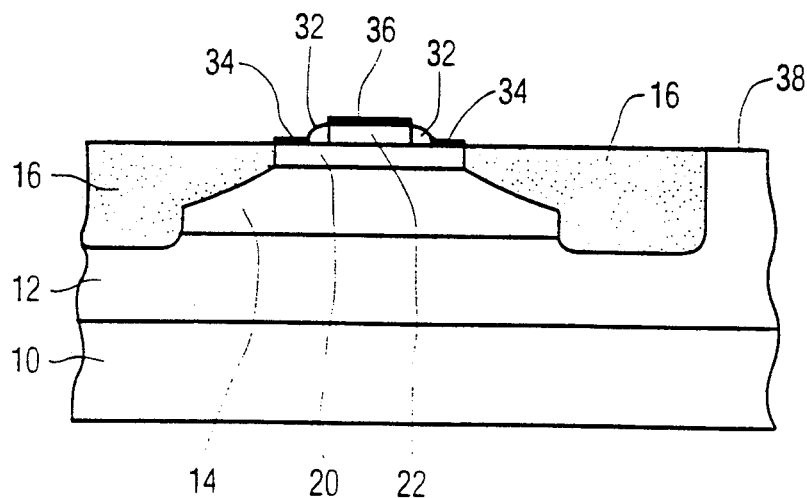

A reactant metal such as platinum, titanium or cobalt is then deposited to, for example, a thickness of about 500 Angstrom units on the entire top surface of the structure depicted in FIG. 5. Next, by standard techniques, the deposited metal is converted to a silicide wherever the metal overlies exposed silicon or polysilicon. The remaining unconverted metal overlying other materials is then removed by etching. As a result, self-aligned low-resistance silicide contacts are thereby formed for the base, emitter and collector regions. In FIG. 6, these silicide contacts comprise base contact 34, emitter contact 36 and collector contact 38.

Subsequently, other standard illustrative steps are carried out to complete the fabrication of the device. These steps include, for example, forming on the surface of the device structure a 5000 Angstrom units thick layer of tungsten in a CVD step, and then depositing a layer of photoresist about 8000 Angstrom units thick on top of the tungsten layer. In known ways, the photoresist layer is then thermally treated to cause it to flow. As a result, a planar-top photoresist layer is thereby formed. The aforedescribed tungsten layer and the overlying planarized photoresist layer are shown in FIG. 7 where they are designed by reference numerals 40 and 42, respectively.

Figure 7:
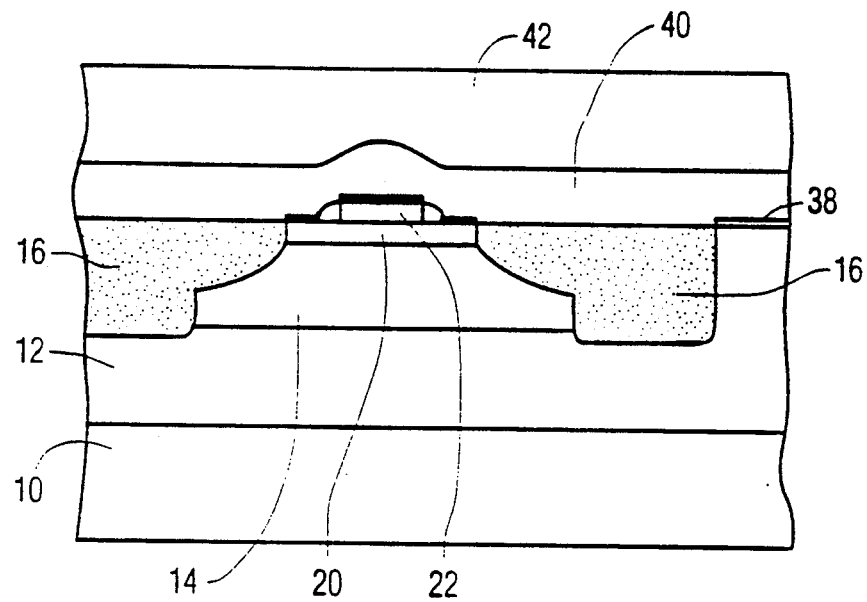
Figure 8:
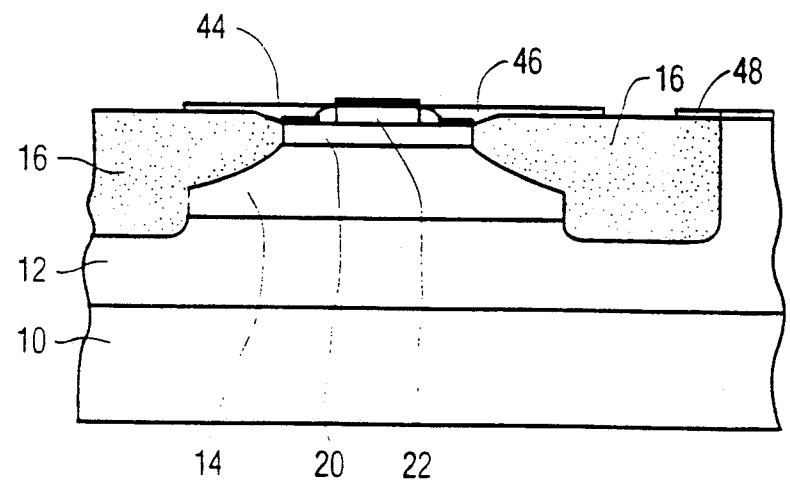

By standard techniques, the photoresist and tungsten layers shown in FIG. 7 are then etched at the same rate to remove tungsten from the emitter region 22. The remaining self-aligned tungsten is then masked and patterned. Tungsten straps 44, 46 and 48 (FIG. 8) are thereby provided. These can be used as local interconnects or as areas to be contacted from another level of the integrated-circuit structure through an overlying dielectric layer (not shown).

Thus, in the particular illustrative manner described in detail above, a high-speed bipolar transistor device characterized by a small collector-base junction area and a low $r_b$ can be realized. In accordance with the invention, the fabrication process for the device is based on a unique two-step sequence in which self-aligned spacers are successively formed to define critical features of the device.

Finally, it is to be understood that the above-described procedures and arrangements are only illustrative of the principles of the present invention. In accordance with these principles, numerous modifications and alternatives may be devised by those skilled in the art without departing from the spirit and scope of the invention. Thus, for example, although emphasis herein has been directed to a fabrication sequence for making an NPN bipolar transistor device, it is of course apparent that the sequence can be easily modified to make PNP devices.

What is claimed is:

1. A method for fabricating a bipolar transistor device in a semiconductor wafer, such method comprising the steps of:

forming in said wafer an oxide isolation region which extends to the surface of said wafer;

forming a buried collector of one conductivity type in said wafer which laterally extends to said oxide isolation region;

forming in said wafer overlying said collector and extending to the surface of said wafer a base region of the opposite conductivity type in which is to be formed a base comprising an intrinsic base and a laterally adjoining extrinsic base having a base link portion and a base contact portion;

forming an emitter of said one conductivity type on the surface of said wafer overlying said base region and having a lateral extent that is less than that of said base region;

forming a self-aligned first spacer laterally adjoining said emitter and overlying said extrinsic base portion of said base region;

oxidizing the portion of said base region which laterally extends beyond said extrinsic base portion thereof, to thereby define the lateral extent and alignment of said extrinsic base with respect to said emitter;

removing said first spacer;

doping said extrinsic base to enhance the conductivity thereof to a specified value for said base link portion thereof;

forming a second self-aligned spacer laterally adjoining said emitter and overlying only the portion of said extrinsic base which is to constitute said base link;

doping the portion of said extrinsic base which is not covered by said second spacer so as to enhance the conductivity thereof to a specified value for said base contact; and forming electrical connections to said collector, said emitter and said base contact.

2. A method as in claim 1 wherein a thin layer of silicon dioxide is formed on the surfaces of said emitter and said base region before forming said first spacer.

3. A method as in claim 2 wherein said first spacer is formed by depositing on the entire surface of said layer of silicon dioxide a first layer of masking material, and then anisotropically etching said first layer to expose the portion of said layer of silicon dioxide that overlies the portion of said base region which laterally extends beyond said extrinsic base.

4. A method as in claim 3 wherein said second spacer is formed by depositing on the entire top surface of said layer of silicon dioxide a second layer of masking material, and then anisotropically etching said second layer to expose the top surface of said emitter and the top surface of said base contact portion of said extrinsic base.

5. A method as in claim 4 wherein said first layer of masking material comprises oxynitride.

6. A method as in claim 5 wherein said first layer of masking material is anisotropically etched in a reactive ion-etching step utilizing a $CF_4/O_2$ plasma to form said first spacer.

7. A method as in claim 6 wherein said first spacer is removed in a wet etching step utilizing hot phosphoric acid.

8. A method as in claim 4 wherein said second layer of masking material comprises silicon dioxide.

9. A method as in claim 8 wherein said second layer of masking material is anisotropically etched in a reactive ion-etching step utilizing a $CHF_3/CO_2$ plasma.

* * * * *